United States Patent
Yamazaki

(10) Patent No.: US 7,339,201 B2
(45) Date of Patent: Mar. 4, 2008

(54) LIGHT EMITTING DIODE AND PROCESS FOR PRODUCING THE SAME

(75) Inventor: Shigeru Yamazaki, Kumagaya (JP)

(73) Assignees: Pearl Lamp Works, Ltd., Osaka (JP); Opto-Device Co., Ltd., Kumagaya-shi (JP)

(*) Notice: Subject to any disclaimer, the term of this patent is extended or adjusted under 35 U.S.C. 154(b) by 191 days.

(21) Appl. No.: 10/512,284

(22) PCT Filed: Apr. 24, 2003

(86) PCT No.: PCT/JP03/05341

§ 371 (c)(1),
(2), (4) Date: Jun. 6, 2005

(87) PCT Pub. No.: WO03/092082

PCT Pub. Date: Nov. 6, 2003

(65) Prior Publication Data

US 2005/0231092 A1    Oct. 20, 2005

(30) Foreign Application Priority Data

Apr. 25, 2002 (JP) ............................. 2002-124147

(51) Int. Cl.
*H01L 33/00* (2006.01)

(52) U.S. Cl. ............... 257/99; 257/95; 257/98; 257/10; 257/E33.058; 257/E33.059

(58) Field of Classification Search ............ 257/95, 257/98, 99, 100, E33.058, E33.059
See application file for complete search history.

(56) References Cited

U.S. PATENT DOCUMENTS 6,404,131 B1 * 6/2002 Kawano et al. ............. 315/82
6,641,287 B2 * 11/2003 Suehiro ..................... 362/298
6,652,795 B2 * 11/2003 Konishi et al. ........ 264/272.13
6,727,643 B2 * 4/2004 Suehiro ..................... 313/499
6,729,746 B2 * 5/2004 Suehiro et al. ............. 362/241

(Continued)

FOREIGN PATENT DOCUMENTS

EP    0933823 A2    8/1999

(Continued)

*Primary Examiner*—Evan Pert
*Assistant Examiner*—Victor A. Mandala, Jr.
(74) *Attorney, Agent, or Firm*—Birch, Stewart, Kolasch & Birch, LLP

(57) ABSTRACT

A light emitting diode includes a casing having a concave surface, a reflecting surface formed by depositing a metallic layer on a concave surface thereof, and a lead having a light emitting element fitted thereto so as to confront the reflecting surface. A cationic polymerization type transparent epoxy resin is filled within a cavity of the casing having the concave surface, and the resin is hardened while the resin, the reflecting surface and the casing form a sandwich structure. With this construction, the light emitting diode is provided, in which neither wrinkling nor cracking occur in the reflecting surface. In addition, there is no possibility of the reflecting surface being flawed during the handling and transportation. Also, even in a reflow furnace operation in which a soldering is carried out, thermal deformation including formation of wrinkling and cracking in the reflecting surface can be completely avoided. Yet, since the cationic polymerization type transparent epoxy resin has so low a rate of shrinkage after hardening that the planarity of a light radiating surface after the hardening can be maintained and, for this reason, rays of light emerging from the light radiating surface can be emitted to the outside without being refracted at the interface between the light radiating surface and the outside.

14 Claims, 4 Drawing Sheets

U.S. PATENT DOCUMENTS

| | | | |
|---|---|---|---|
| 6,943,379 B2 * | 9/2005 | Suehiro et al. ............... | 257/99 |
| 7,161,187 B2 * | 1/2007 | Suehiro et al. ............... | 257/98 |
| 2001/0024087 A1 | 9/2001 | Suehiro et al. | |
| 2001/0045573 A1 | 11/2001 | Waitl et al. | |

FOREIGN PATENT DOCUMENTS

| | | |
|---|---|---|
| JP | 49-82290 | 12/1972 |
| JP | 55-113570 | 2/1979 |
| JP | 55-118681 A | 9/1980 |
| JP | 58-82290 A | 5/1983 |
| JP | 60-103650 | 6/1985 |
| JP | 62-269984 A | 11/1987 |
| JP | 63-173279 U | 11/1988 |
| JP | 01-143366 A | 6/1989 |
| JP | 01143368 * | 6/1989 |
| JP | 10-215004 | 8/1998 |
| JP | 2001-148509 | 5/2001 |
| JP | 2001-185760 | 7/2001 |
| JP | 2001-267367 | 9/2001 |
| JP | 2002-110704 | 4/2002 |
| JP | 2002-232018 | 8/2002 |
| JP | 2002-299693 A1 | 10/2002 |

* cited by examiner

LIGHT EMITTING DIODE AND PROCESS FOR PRODUCING THE SAME

FIELD OF THE INVENTION

The present invention relates to a light emitting diode having a reflecting surface covered by a cationic polymerization transparent epoxy resin, which is a kind of a hardening accelerating epoxy resin, and a method of making the same.

BACKGROUND ART

The structure of a light emitting diode for effectively radiating rays of light, emitted from a light emitting element, outwardly frontward through a metallic reflecting surface is disclosed in numerous patent publications. In those prior arts, the structure can be classified into three types including a first type in that the metallic reflecting layer is vapor deposited on an outside of the casing, a second type in that the metallic reflecting layer is vapor deposited on an inside of the casing, and a third type in that the metallic reflecting layer pre-manufactured is employed.

As a first example in which the metallic reflecting layer is formed on an outside of the casing, light emitting diodes disclosed in the Japanese Laid-open Patent Publications No. 49-82290 and No. 58-82290 are well known in the art. In the light emitting diode of the type shown in FIG. 6, the light emitting element 61 is fixedly mounted on a lead 62a by means of an electroconductive bonding agent 63 and is electrically connected with a lead 62b through a gold wire 64. The light emitting element 61 fitted to the leads 62a and 62b are inserted into a mold having a cavity of a semispherical shape or a parabolic shape and are integrated and encapsulated together by means of a transfer molding technique using a light transmissive resin 65. Thereafter, an outer convex surface of a semispherical shape or a parabolic shape is subjected to a surface coating treatment by means of a metal vapor deposition or plating to form a concave reflecting surface 66 and is subsequently applied an overcoat layer 67 to protect the concave reflecting surface 66. The concave reflecting surface 66 is utilized to reflect rays of light emitted from the light emitting element 61 so that they can be radiated outwardly from a radiating surface 68. With this structure, almost all of the light emitted from the light emitting element 61 can be reflected from the reflecting surface 66 and then radiated outwardly of the light emitting diode through the radiating surface 68.

As a second example in which the metallic reflecting surface is formed on an inside of the casing, light emitting diodes disclosed in the Japanese Laid-open Patent Publications No. 62-269984 and No. 01-143366 and the Japanese Laid-open Utility Model Publication No. 55-113570 are well known in the art. In the light emitting diode of the type shown in FIG. 7, the light emitting element 71 is positioned in alignment with the focal point of the reflecting surface 72 vapor deposited with aluminum or silver in a concave surface portion of the casing 71 or provided with a plated layer. This is similar to the first example described above as far as one end of the light emitting element 73 is fitted to a lead 74a by the use of an electroconductive bonding agent while the opposite end is electrically connected with a lead 74b through a gold wire 75.

In those light emitting diodes, aluminum or silver is vapor deposited, or the plated layer 72 is provided, on the concave surface portion of the casing 71. Subsequently, the leads 74a and 74b are inserted into the casing 71 and, thereafter, the light emitting element 73 is connected at one end to the lead 74a by the use of an electroconductive bonding agent and at the other end to the lead 74b electrically through the gold wire 75.

Thereafter, after a transparent epoxy resin 76 is potted to fill up a concave portion of the reflecting surface 72, a heating is carried out to harden it to thereby fix the light emitting element 73. In this type of the light emitting diode, by filling the concave portion with the transparent epoxy resin 76, the relation in optical positions between the reflecting surface 72 and the light emitting element 73 becomes highly accurate and the light emitting diode having an excellent optical characteristic can be obtained and, since the molding process based on the potting method is employed, the light emitting diode can be marketed inexpensively.

As a third example in which the metallic reflecting layer prepared beforehand is employed, light emitting diodes disclosed in the Japanese Laid-open Patent Publication No. 55-118681 and US Published Patent Application No. 2001/0024087 are well known in the art. As shown in FIG. 8, in this type of the light emitting diode, aluminum or silver is vapor deposited or a plated layer is provided in a concave surface portion of a reflecting mirror 85 in the form of a metallic plate and a light emitting diode 81 is arranged so as to be positioned at the focal point of the reflecting mirror 85 in the form of the metallic plate. This is similar to the first example described above as far as one end of the light emitting element 81 is fitted to a lead 82a by the use of an electroconductive bonding agent while the opposite end is electrically connected with a lead 82b through a gold wire 83.

In those light emitting diode, the leads 82a and 82b, the light emitting element 81, the gold wire 83 and the reflecting mirror 85 in the form of the metallic plate vapor deposited with aluminum or silver or provided with the plated layer in the concave surface portion are integrated together by means of a transfer molding process using a transparent epoxy resin 84, followed by heating to harden. Even in this type of the light emitting diode, since the reflecting mirror 85 and the light emitting element 81 are encapsulated with the transparent epoxy resin 84, the relation in optical positions between the reflecting mirror 85 and the light emitting element 81 becomes highly accurate and the light emitting diode having an excellent optical characteristic can be obtained.

However, with the light emitting diode having the structure in the first example, in which the metallic reflecting surface is provided outside the casing, since the light emitting diodes are packaged for shipping with the reflecting surfaces exposed to the outside, even though the protective layer is employed in the form of a hard coating, contact between the reflecting surfaces and contact between the reflecting surface and tips of the leads will often bring about flaws appearing on the reflecting surface having been passed through the protective (hard coating) layer during surface mounting or handling of the light emitting diodes after being unpackaged. Because of the flaws, there have been problems in that the reflecting performance of the reflecting surface tends to be lowered and the reflecting surface tends to be deteriorated quickly.

It is to be noted that when electric or electronic component parts are to be surface mounted on a circuit board, the circuit board in its entirety is generally passed through the solder reflow furnace having an atmosphere of about 250° C. so that the component parts can be soldered to circuits on the circuit board. Accordingly, when the light emitting diode having the above described metallic reflecting surface is surface mounted on the circuit board and is passed through the solder reflow furnace, the circuit board including the light emitting diode is naturally heated to a temperature about equal to 250° C. As such, wrinkling and/or cracking may occur in the reflecting surface due to the difference in coefficient of thermal expansion between the transparent epoxy resin and the silver or aluminum metallic layer forming the reflecting surface, accompanied by reduction in reflectivity of the reflecting surface, which eventually leads to reduction in optical characteristics.

In addition, during transportation of the light emitting diodes, special package must be employed so that the reflecting surface of each of the light emitting diodes will not be impaired by the effect of vibrations.

In the case of the light emitting diode of the structure in which it is integrally molded only with the conventional epoxy resin, an additional problem has been found, in which an abnormal stress will act on end faces of the epoxy resin during bending of the leads protruding outwardly from the light emitting diode, which is effected at the time of surface mounting on the substrate, and cracking eventually occurs in portions of the epoxy resin where the leads extend.

On the other hand, In the second example in which the metallic reflecting surface is provided inside the casing, the transparent epoxy resin is filled within a concave portion of a concave reflecting body by means of the potting technique to thereby fix the light emitting element and the concave reflecting surface. However, when the transparent epoxy resin undergoes shrinkage as it hardens, it often occurs that wrinkling and cracking occurs in the concave reflecting surface due to the difference between the thermal expansion coefficient of the transparent epoxy resin and that of silver or aluminum used to form the concave reflecting surface. In the worst case, the concave reflecting surface may exfoliate with debris scattering into the epoxy resin. In such case, as is the case discussed hereinabove, a practically considerable problem arises in that the reflectivity decreases to such an extent as to lower the optical characteristic thereof. For this reason, the reflecting characteristic is in practice secured by employing a white ABS resin or the like having a high reflectivity with no metal used in the concave reflecting portion, the truth is that no sufficient reflectivity can be obtained.

In the third case in which the metallic reflecting layer prepared beforehand is employed, by integrating the light emitting element 81 and the reflecting mirror 85 in FIG. 8 together by the use of the transparent epoxy resin, the light emitting element and the concave reflecting surface are fixed together. However, in this third example, after the reflecting mirror 85 has been manufactured in a separate process step, the light emitting element 81 and the reflecting mirror 85 are integrated together by the use of the transparent epoxy resin and, therefore, the number of process steps increases, resulting in increase of the price of the light emitting diode.

Also, in the conventional light emitting diode in which the light emitting element and the reflecting mirror are integrated together by the use of the transparent epoxy resin, since the rate of shrinkage during the hardening is considerably great, as shown by reference numeral 68 in FIG. 6, reference numeral 78 in FIG. 7 and reference numeral 88 in FIG. 8, the light radiating surface after the hardening is not a flat surface, but a concave surface and, hence, brings about an effect similar to that afforded by the reflecting surface fitted with a concave lens and, accordingly, there has been a problem that rays of light are not reflected from the reflecting surface as specified by the optical design.

SUMMARY OF INVENTION

The present invention has been devised in view of the foregoing and is intended to provide a light emitting diode of a structure in which the light emitting element and the reflecting surface are integrated together with the transparent epoxy resin, in which a cationic polymerization type transparent epoxy resin is employed for the transparent epoxy resin so that neither wrinkling nor cracking occur in the reflecting surface during the manufacture; it can be easily handled with no special package required during the transportation; neither wrinkling nor cracking will occur in the reflecting surface even when it is passed through a high temperature atmosphere in the reflow furnace; the planarity of the light radiating surface can be secured even after the hardening because of a low rate of shrinkage during the hardening; and rays of light emitted from the light radiating surface can therefore be radiated to the outside without being refracted at the interface between the light radiating surface and the outside or an environment.

In order to resolve the foregoing problems, the light emitting diode of the present invention includes a casing having a concave cavity defined therein, a reflecting surface formed by depositing a metallic layer on a surface defining the concave cavity, and a lead having a light emitting element fitted thereto so as to confront the reflecting surface, characterized in that a cationic polymerization type transparent epoxy resin is filled within the concave cavity of the casing and in that the cationic polymerization type transparent resin is cured while a sandwich structure is formed by the cationic polymerization transparent epoxy resin, the reflecting surface and the casing. Thus, since the cationic polymerization type transparent epoxy resin is slowly hardened while the sandwich structure is maintained, an advantage can be appreciated that neither wrinkling nor cracking occurs in the reflecting surface at the time of completion of the hardening.

Also, since the cationic polymerization transparent epoxy has a rate of shrinkage after the hardening is so low that the planarity of the light radiating surface can be secured after the hardening and, therefore, rays of light emitted from the light radiating surface can be radiated to the outside without being refracted at the interface between the light radiating surface and the outside.

Preferably, the lead is engaged in a groove formed on an upper end face of the casing, a light curable epoxy resin is filled in the groove, where the lead is engaged, to a level flush with the upper end face of the casing, and the light curable epoxy resin is cured by irradiation of ultraviolet rays of light to fix the lead in the groove in the casing, and further, the cationic polymerization transparent epoxy resin is filled to a level flush with the upper end face of the casing. With this construction, since the lead, the light emitting element and the reflecting surface are fixed in an integrated form, the light emitting diode, of which optical relation in position is highly accurate, can be obtained.

Also preferably, the light emitting diode of the present invention includes a frame for covering the upper end face of the casing, which frame has a projection for filling up a gap between an upper surface of the lead, engaged in the groove, and the frame, the projection filling up the gap when the frame is mounted onto the casing. With this construction, advantages can be obtained that the cationic polymerization transparent epoxy resin will not leak from the groove during the hardening and, at the same time, the strength of the lead after the hardening of the light emitting diode against bending can be increased.

Also preferably, the casing of the light emitting diode of the present invention is made of a heat resistant resin selected from the group consisting of a polycarbonate resin, PPC alloyed resin, and a polyether ether ketone resin. In addition, the casing of the light emitting diode of the present invention may be so designed as to contain glass fibers in the resin. The use of the heat resistant resin or the resin containing the glass fibers makes it possible to obtain the light emitting diode of a kind having a high heat resistance sufficient to eliminate formation of either wrinkling or cracking on the reflecting surface even when heated by a high temperature heat evolved during the solder reflow process.

Also preferably, the casing of the light emitting diode of the present invention is made of a resin containing glass fibers and an undercoat layer of a heat resistant epoxy resin is formed on the surface defining the concave cavity in the casing, and further, a metallic reflecting surface or layer is formed on the undercoat layer. With this construction, the light emitting diode highly resistant to heat and excellent in reflectivity can be obtained.

In addition, according to another aspect of the invention, the present invention also provides a method of making a light emitting diode, which includes a step of forming a casing having a concave cavity defined therein, a step of forming a metallic layer in the concave cavity to define a reflecting surface, and a step of forming a lead having a light emitting element fitted thereto so as to confront the reflecting surface. In this light emitting diode making method, there is provided a step of filling a cationic polymerization type transparent epoxy resin within the concave cavity of the casing, and a step of curing the cationic polymerization type transparent epoxy resin while the cationic polymerization transparent epoxy resin, the reflecting surface and the casing are formed in a sandwich structure. In the present invention, since the cationic polymerization type transparent epoxy resin is slowly hardened while the sandwich structure is maintained, an advantage can be appreciated that neither wrinkling nor cracking occurs in the reflecting surface at the time of completion of the hardening.

Also, since the cationic polymerization transparent epoxy has a rate of shrinkage after the hardening is so low that the planarity of the light radiating surface can be secured after the hardening and, therefore, rays of light emitted from the light radiating surface can be radiated to the outside without being refracted at the interface between the light radiating surface and the outside.

Preferably, the step of filling the cationic polymerization type transparent epoxy resin in the light emitting diode making method of the present invention includes a step of engaging the lead in a groove formed in an upper end face of the casing; a step of filling a light curable epoxy resin in the groove, in which the lead is engaged, to the upper end face of the casing, irradiating the light curable epoxy resin with ultraviolet rays of light to thereby fix the lead in the groove in the casing, and a step of filling the cationic polymerization transparent epoxy resin to a level flush with the upper end face of the casing. In the present invention, by means of those steps, leakage of the resin can be completely avoided.

Also preferably, the step of filling the cationic polymerization type transparent epoxy resin in the light emitting diode making method of the present invention includes a step of engaging the lead in a groove formed in an upper end face of the casing; a step of covering the casing with a frame for covering the upper end face of the casing and having a projection at a location corresponding to or aligned with the groove in the casing; and a step of filling the cationic polymerization type transparent resin to a level flush with the upper end face of the casing. By those process steps, leakage of the resin can be completely avoided.

Also preferably, in the step of forming the casing having the concave cavity defined therein according to the present invention, a heat resistant resin selected from the group consisting of a polycarbonate resin, a PPC alloyed resin, and polyether ether ketone can be used as material for the casing. In addition, this filling step may be so designed as to allow the resin to contain glass fibers. The use of the heat resistant resin or the resin containing the glass fibers makes it possible to obtain the light emitting diode of a kind having a high heat resistance sufficient to eliminate formation of either wrinkling or cracking on the reflecting surface even when heated by a high temperature heat evolved during the solder reflow process.

Also preferably, the step of forming the casing having the concave cavity defined therein according to the present invention may further include a step of, after glass fibers have been contained in the resin and an undercoat layer of a heat resistant epoxy resin has been formed on the surface defining the concave cavity in the casing, forming a metallic reflecting surface on the undercoat layer. With this construction, the planarity of the concave surface becomes good and the light emitting diode excellent in reflectivity can be obtained.

BEST MODE FOR CARRYING THE INVENTION

Hereinafter, a preferred embodiment of the present invention will be described in detail with particular reference to FIGS. 1 to 5.

Figure 1:
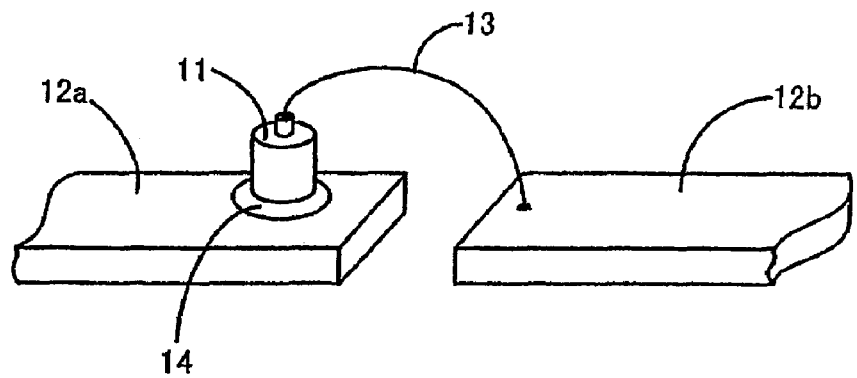
FIG. 1 is a schematic explanatory diagram showing a light emitting element mounted on a lead, which is used in a light emitting diode according to the present invention.

FIG. 1 illustrates a schematic diagram used to explain a light emitting element mounted on a lead used in a light emitting diode according to the present invention. The light emitting element 11 is rigidly connected at one end with a lead 12a by means of an electroconductive bonding agent 14 and at the opposite end with a lead 12b through a gold wire 13. The light emitting element so connected with the leads is prepared in readiness for the practice of the present invention.

Figure 2A:
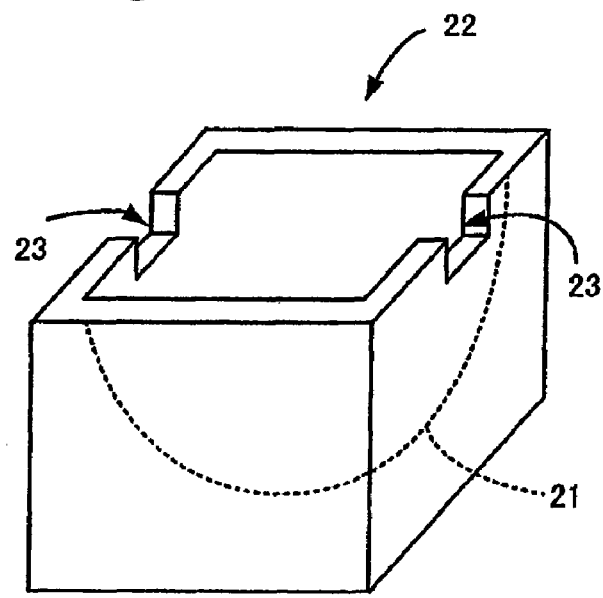
FIGS. 2a and 2b are a schematic perspective view and a schematic side view, respectively, showing a casing used in the light emitting diode according to the present invention.
Figure 2B:
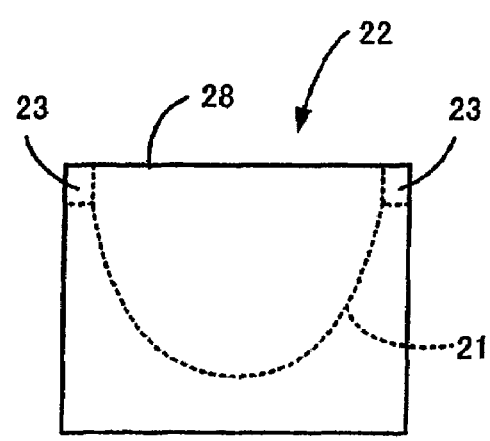

FIGS. 2a and 2b illustrate a schematic perspective view and a schematic side view of a casing used in the light emitting diode of the present invention. As shown in FIGS. 2a and 2b, the casing 22 is made of a synthetic resin in its entirety and is formed with a concave cavity defining a concave surface which is in turn vapor deposited with a plated layer of aluminum or silver to provide a reflecting surface 21. With the concave cavity defined in the casing 22, the casing has four side edges left in that surface thereof, which surround the opening leading into the concave cavity, and grooves 23 each being of a size matching with the size of the corresponding lead are formed in two opposite side edges of the casing 22. As will be described later, and as shown in FIG. 2b, a cationic polymerization type transparent epoxy resin, when filled within the concave cavity to a level flush with that surface of the casing 22 at which the concave cavity opens, defines a light radiating surface 28 from which rays of light reflected from the reflecting surface 21 emerge outwardly.

Figure 3:
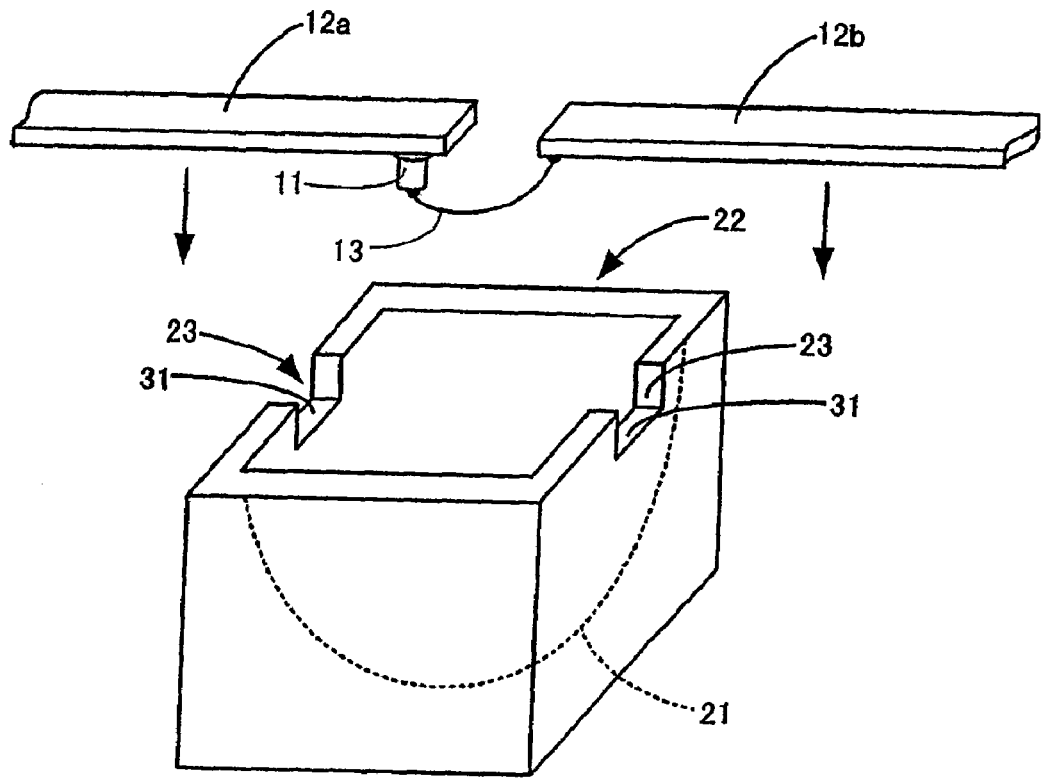
FIG. 3 is a schematic perspective view showing the relation between the casing and the lead, which are used in the light emitting diode according to the present invention.

FIG. 3 illustrates an explanatory diagram showing the relation between the casing 22 and the leads 12a and 12b, both employed in the light emitting diode of the present invention. As shown therein, the leads 12a, 12b having the light emitting diode 11 mounted thereon are mounted on the casing 22 so as to engage in the respective grooves 23, with the light emitting element 11 oriented downwardly towards the light reflecting surface 21. When the leads 12a, 12b are to be engaged in the respective grooves 23 in the casing 22, a small quantity of a light curable resin or bonding resin 31 has to be applied by the use of a dispenser to respective portions of the leads 12a and 12b, which are received within the associated grooves 23, so that the leads 12a and 12b can be firmly anchored in the respective grooves 23 when the light curable resin or bonding resin 31 is subsequently cured.

Then, the cationic polymerization type transparent epoxy resin is filled within the concave cavity in the casing 22 to a level flush with that surface of the casing 22 where the concave cavity opens, followed by curing of the epoxy resin within a furnace of an atmosphere heated to a temperature within the range of 80 to 130° C. In order to harden the transparent epoxy resin, the present invention is featured in and by the use of the cationic polymerization type transparent epoxy resin.

Specifically, for curing the transparent epoxy resin, a method is generally employed, in which an epoxy resin and a curing agent are filled within the concave cavity of the casing 22. With this method utilizing the curing agent, the two components, that is, the epoxy resin and the curing agent are mixed in a predetermined mixing ratio and are subsequently heated to accelerate a chemical reaction between those two components before the mixture is hardened. In the practice of that method, the transparent epoxy resin and the curing agent are generally employed in the form of a bisphenol epoxy resin and methyl tetrahydrophthalic anhydride (Me-THPA), respectively.

However, the use of such a curing agent has been found having a problem in that since the transparent epoxy resin abruptly hardens when the extent of reaction is about 85%, an abrupt shrinkage of the transparent epoxy resin takes place at the interface between the transparent epoxy resin and the reflecting surface 21, with the consequence that the reflecting surface 21 tends to exfoliate or wrinkle.

On the other hand, in the practice of the present invention, in which the cationic polymerization type transparent epoxy resin is employed, hardening of the epoxy resin takes place steadily during a period of time in which the extent of reaction is about 20% to about 90% and, since the hardening thus takes place slowly, the use of the cationic polymerization type transparent epoxy resin would result in neither exfoliation nor wrinkling of the reflective surface when the hardening completes.

Also, due to the cationic polymerization type transparent epoxy resin having a low degree of shrinkage, the light radiating surface 28 in FIG. 2b can be kept so flat after the transparent epoxy resin has been hardened, that rays of light emerging outwardly from the light radiating surface 28 can be radiated to the outside without being refracted at the interface between the light radiating surface 28 and the outside of the light emitting diode.

In addition, in the light emitting diode of the present invention, the reflecting surface is protected from external mechanical shocks and thermal shocks by the casing 22 made of a heat resistant resin, the reflecting surface 21 can be sufficiently protected from flaws during handling and/or transportation thereof.

During passage through a reflow furnace in the practice of a surface mounting using a soldering technique, a circuit substrate having one or more light emitting diodes mounted thereon tends to be heated to a temperature of about 250° C. With the light emitting diode of the present invention, however, since the cationic polymerization type transparent epoxy resin is hardened while the cationic polymerization transparent epoxy resin, the reflecting surface and the casing are assembled in a sandwich structure, the difference between the coefficient of thermal expansion of the cationic polymerization type transparent epoxy resin and the coefficient of thermal expansion of a silver or aluminum layer defining the reflecting surface will bring about neither wrinkling and/or cracking in the reflecting surface, nor reduction in reflectivity of the reflecting surface and, hence, no reduction in optical characteristics.

Figure 4:
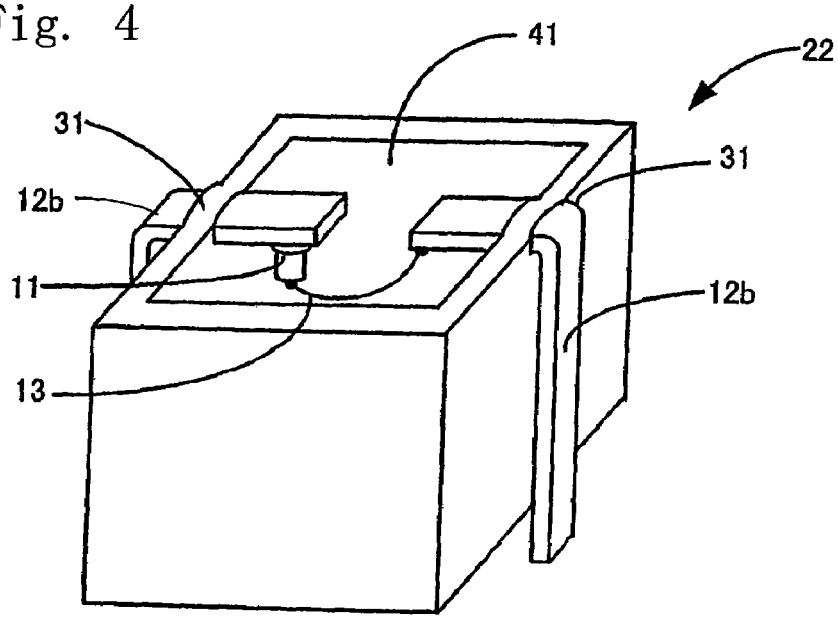
FIG. 4 is a schematic perspective view of the light emitting diode according to the present invention, with the leads shown as mounted on the casing.

FIG. 4 illustrates a perspective view of the light emitting diode of the present invention in a completed form, with the leads 12a, 12b engaged in the corresponding grooves 23 in the casing. As shown therein, the leads 12a, 12b are engaged in the corresponding grooves 23 in the casing 22, in which condition small deposits of the light curable resin or bonding resin 31, applied dropwise by the use of a dispenser to those portions of the leads 12a, 12b engaged in the corresponding grooves 23, have been hardened. Thereafter, portions of the leads extending outwardly from the corresponding grooves 23 are bent to follow adjacent side surfaces of the casing 22 to complete electric power supply terminals, respectively.

Figure 5:
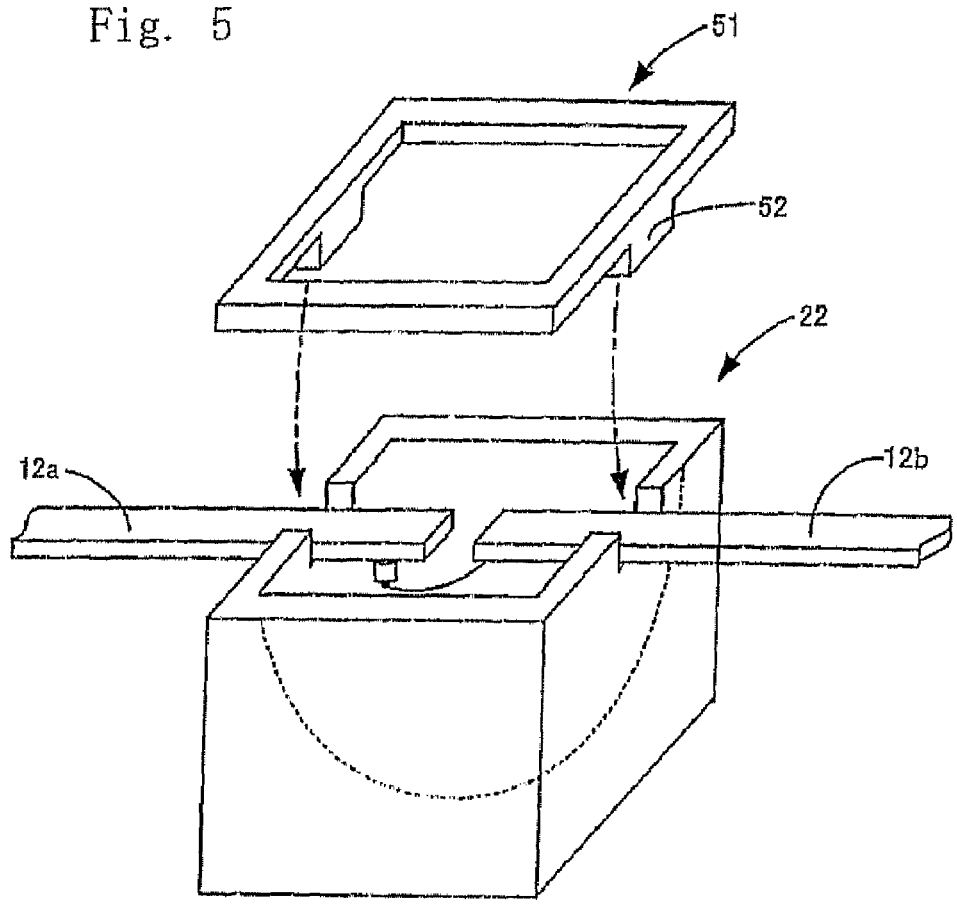
FIG. 5 is a schematic perspective view of the light emitting diode according to the present invention, showing the manner in which a frame is mounted on the casing having the leads mounted thereon.
Figure 6:
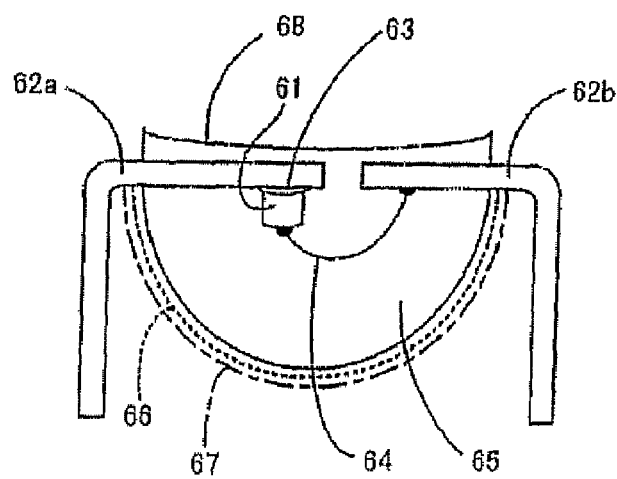
FIG. 6 is a schematic side view showing the conventional light emitting diode of a reflecting type, including a light emitting element and a semispherical body, encapsulated with an epoxy resin, with a reflecting surface formed on an outer surface of the semispherical body.
Figure 7:
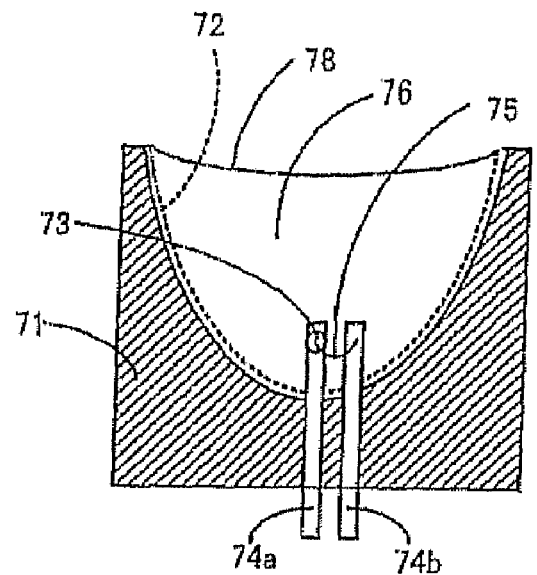
FIG. 7 is a schematic side sectional view showing another conventional light emitting diode of a reflecting type, including a light emitting element and a reflecting surface, formed on an concave surface area of the casing, both encapsulated with an epoxy resin.
Figure 8:
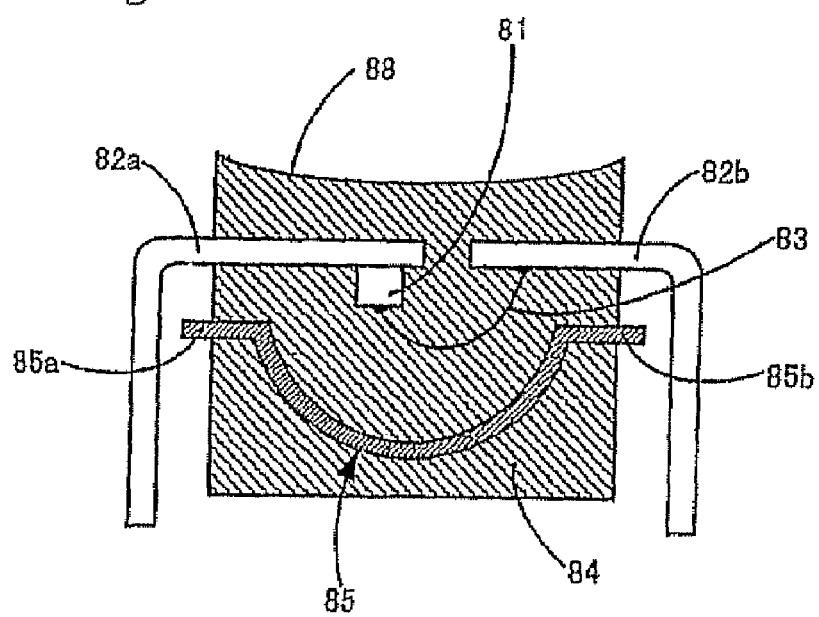
FIG. 8 is a schematic side sectional view of a further conventional light emitting diode utilizing a reflecting mirror.

FIG. 5 illustrates an explanatory diagram showing the casing with the leads engaged in the corresponding grooves and with a frame subsequently mounted onto the casing. In order to assuredly avoid leakage of the deposited light curable resin or bonding resin applied to those portions of the leads engaged in the corresponding grooves 23 and also to enhance the strength of the leads when the latter are bent, a frame 51 having projections 52 formed integrally therewith at respective locations aligned with the grooves 23 is mounted on the casing 22 over the leads 12a, 12b. Each of the projections 52 has a shape filling up gaps or recesses left in the grooves 23 when the leads 12a, 12b are engaged in the grooves 23 and the projections 52 engaged in the associated recesses. With this design, the light curable resin or bonding resin 31 can be completely prevented from leaking and, by applying a bonding agent to a joint between the frame 51 and the casing 22, the strength of those engagement portions, when the leads 12a, 12b are bent, can be increased. At this time, by applying a bonding agent to a joint between the frame 51 and the casing 22, the workability of filling the cationic polymerization transparent epoxy resin can advantageously be increased.

Although in the foregoing, polycarbonate resin has been used as material for the casing 22, a polycarbonate resin reinforced with glass fibers, an alloyed resin prepared of an ARTON® resin and PPS (polyphenylene sulfide), or a polyether ether ketone resin may be employed therefor, in which case the heat resistance can be increased. The use of the glass fiber reinforced resin is effective to further increase the heat resistance during the solder reflow process and has made it possible to provide the light emitting diode having a practically excellent characteristic, i.e., a high heat resistance with neither wrinkling nor cracking occurring in the reflecting surface under the influence of heat of a high temperature.

Where the glass fiber reinforced resin is used as material for the casing 22, the light emitting diode having an excellent reflectivity can be obtained if in order to secure a mirror surface on a reflecting surface, a light curable epoxy resin or a two-component type epoxy resin having a low viscosity is coated to a thickness of a few micrometers and a metallic film is, after the surface of the glass fiber reinforced resin has been smoothened, vapor deposited on the surface.

What is claimed is:

1. A light emitting diode comprising a casing having a concave cavity defined therein, a reflecting surface formed by depositing a metallic layer on a surface defining the concave cavity, and a lead having a light emitting element fitted thereto so as to confront the reflecting surface,
   wherein a cationic polymerization type transparent epoxy resin is filled within the concave cavity of the casing, wherein the lead is engaged in a groove formed on an upper end face of the casing, a light curable epoxy resin is filled in the groove, where the lead is engaged, to a level flush with the upper end face of the casing, and the light curable epoxy resin is cured by irradiation of ultraviolet rays of light to fix the lead in the groove in the casing, and further, the cationic polymerization transparent epoxy resin is filled to a level flush with the upper end face of the casing, and
   wherein the cationic polymerization type transparent resin is cured while a sandwich structure is formed by the cationic polymerization transparent epoxy resin, the reflecting surface and the casing.

2. The light emitting diode as claimed in claim 1, wherein the casing is made of a heat resistant resin selected from the group consisting of a polycarbonate resin, PPC alloyed resin, and a polyether ether ketone resin.

3. The light emitting diode as claimed in claim 2, wherein the casing is made of a resin containing glass fibers, and in that an undercoat layer of a heat resistant epoxy resin is formed on the surface defining the concave cavity in the casing, and further, a metallic reflecting surface is formed on the undercoat layer.

4. The light emitting diode as claimed in claim 1, wherein a frame for covering the upper end face of the casing is provided, and in that the frame has a projection for filling tip a gap between an upper surface of the lead, engaged in a groove, and the flame, the projection filling tip the gap when the flame is mounted onto the casing.

5. The light emitting diode as claimed in claim 4, wherein the casing is made of a heat resistant resin selected from the group consisting of a polycarbonate resin, PPC alloyed resin, and a polyether ether ketone resin.

6. The light emitting diode as claimed in claim 5, wherein the casing is made of a resin containing glass fibers, and in that an undercoat layer of a heat resistant epoxy resin is formed on the surface defining the concave cavity in the casing, and further, the metallic reflecting surface is formed on the undercoat layer.

7. A method of making a light emitting diode, comprising a step of forming a casing having a concave cavity defined therein, a step of forming a metallic layer in the concave cavity to define a reflecting surface, and a step of forming a lead having a light emitting element fitted thereto so as to confront the reflecting surface, characterized in that there is provided:
   a step of filling a cationic polymerization type transparent epoxy resin within the concave cavity of the casing, and
   a step of curing the cationic polymerization type transparent epoxy resin while the cationic polymerization transparent epoxy resin, the reflecting surface and the casing are formed in a sandwich structure, wherein the step of filling the cationic polymerization type transparent epoxy resin includes:
   a step of engaging the lead in a groove formed in an upper end face of the casing;
   a step of filling a light curable epoxy resin in the groove, in which the lead is engaged, to the upper end face of the casing, irradiating the light curable epoxy resin with ultraviolet rays of light to thereby fix the lead in the groove in the casing, and
   a step of filling the cationic polymerization transparent epoxy resin to a level flush with the upper end face of the casing.

8. The method of making the light emitting diode as claimed in claim 7, wherein during the step of forming the casing having the concave cavity, a heat resistant resin selected from the group consisting of a polycarbonate resin, a PPC alloyed resin, and polyether ether ketone is used as material for the casing.

9. The method of making the light emitting diode as claimed in claim 8, wherein the step of forming the casing having the concave cavity defined therein further includes a step of, after glass fibers have been contained in the resin and an undercoat layer of a heat resistant epoxy resin has been formed on the surface defining the concave cavity in the casing, forming the metallic reflecting surface on the undercoat layer.

10. The method of making the light emitting diode as claimed in claim 7, wherein the filling step comprises:
    a step of engaging the lead in a groove formed in an upper end face of the casing;
    a step of covering the casing with a frame for covering the tipper end face of the casing and having a projection at a location aligned with the groove in the casing; and
    a step of filling the cationic polymerization type transparent resin to a level flush with the upper end face of the casing.

11. The method of making the light emitting diode as claimed in claim 10, wherein during the step of forming the casing having the concave cavity, a heat resistant resin selected from the group consisting of a polycarbonate resin, a PPC alloyed resin, and polyether ether ketone is used as material for the casing.

12. The method of making the light emitting diode as claimed in claim 11, wherein the step of forming the casing having the concave cavity defined therein further includes a step of, after glass fibers have been contained in the resin and an undercoat layer of a heat resistant epoxy resin has been formed on the surface defining the concave cavity in the casing, forming the metallic reflecting surface on the undercoat layer.

13. A light emitting diode comprising a casing having a concave cavity defined therein, a reflecting surface formed by depositing a metallic layer on a sur face defining the concave cavity, and a lead having a light emitting element fitted thereto so as to confront the reflecting surface, wherein a cationic polymerization type transparent epoxy resin is filled within the concave cavity of the casing, and wherein the cationic polymerization type transparent resin is cured slowly during a period of time in which the extent of reaction is 20% to 90% within a furnace of an atmosphere heated to a temperature within the range of 80 to 130° C. while a sandwich structure is formed by the cationic polymerization transparent epoxy resin, the reflecting surface and the casing.

14. A method of making a light emitting diode, comprising a step of forming a casing having a concave cavity defined therein, a step of forming a metallic layer in the concave cavity to define a reflecting surface, and a step of forming a lead having a light emitting element fitted thereto so as to confront the reflecting surface, wherein there is provided:

a step of filling a cationic polymerization type transparent epoxy resin within the concave cavity of the casing, and a step of curing the cationic polymerization type transparent epoxy resin slowly during a period of time in which the extent of reaction is 20% to 90% within a furnace of an atmosphere heated to a temperature within the range of 80 to 130° C. while the cationic polymerization transparent epoxy resin, the reflecting surface and the casing are formed in a sandwich structure.

* * * * *